United States Patent [19]
Yee et al.

[11] Patent Number: 5,210,611
[45] Date of Patent: May 11, 1993

[54] AUTOMATIC TUNING RADIO/TV USING FILTERED SEEK

[75] Inventors: Keen Y. Yee, 16 Deer Ridge, Millwood, N.Y. 10546; Gary W. Kibble, Ossining, N.Y.

[73] Assignee: Keen Y. Yee, Millwood, N.Y.

[21] Appl. No.: 743,865

[22] Filed: Aug. 12, 1991

[51] Int. Cl.⁵ .......................... H04N 5/50; H04N 7/04
[52] U.S. Cl. .................................. 358/191.1; 358/142; 358/147; 358/146; 358/194.1; 455/151.1; 455/186.1
[58] Field of Search ............... 358/191.1, 192.1, 193.1, 358/194.1, 188, 189, 142, 146, 147, 86; 455/151, 154, 158, 186

[56] References Cited

U.S. PATENT DOCUMENTS

| | | | |
|---|---|---|---|
| 4,698,677 | 10/1987 | Kinghorn | 358/147 |
| 4,706,121 | 11/1987 | Young | 358/146 |
| 4,910,595 | 3/1990 | Bugg | 358/147 |
| 4,959,720 | 9/1990 | Duffield | 358/191.1 |
| 5,045,947 | 9/1991 | Beery | 358/192.1 |

*Primary Examiner*—James J. Groody
*Assistant Examiner*—Sherrie Hsia

[57] ABSTRACT

An apparatus and technique for automatic tuning (to an arbitrary broadcast frequency) of an audio-video or audio device in accordance with a topic selection made by a user. Knowledge of specific broadcasted programs and times is not necessary. A user makes a selection of a subject matter topic from a menu or list and the necessary tuning is thereafter automatically done under control of a menu or list control interface. In the example of digital information transmitted in the vertical blanking interval of a video signal, the menu control interface automatically adjusts the tuner in accordance with the menu selection made by the user to choose an arbitrary channel and page of information within that channel. The menu or menus can be transmitted with the incoming information, or can be stored internally. Digital data can also be transmitted with the broadcast signal to characterize the subject matter content of the broadcast signal. In this latter situation, the tuner will seek to any arbitrary frequency having a digital code matching the subject matter topic chosen by the user.

14 Claims, 3 Drawing Sheets

AUTOMATIC TUNING RADIO/TV USING FILTERED SEEK

DESCRIPTION

1. Field of the Invention

This invention relates to an apparatus which can be used with any type of audio-video device (TV, monitor, radio etc.) having a tuner which is used to select a frequency or frequency range, and more particularly to an apparatus which will provide automatic customized tuning to an arbitrary frequency(s) in accordance with the selection of a subject matter (topic) by a user, thereby relieving the user of the necessity of extensive interaction with the audio-video device in order to locate a channel or station which carries the desired information.

2. Background Art

In presently used radios and TVs, many stations or channels broadcast information which covers a wide range of topics including topics such as news, sports, music, comedies, etc. Within each of these categories many different breakdowns occur. For example, sports can encompass baseball, basketball, track and field, horse racing, etc. Within each of these sub-categories, further breakdowns can be made. For example, baseball could include baseball games being played by any of the major league or minor league teams. The selection of a particular station or channel covering the particular event, for example a particular baseball game, is not straight-forward, and for that reason many different types of guides are published to help the user locate the station or channel carrying the specific program in which he or she is interested.

In the radios in common use today there exist two ways to indirectly select a broadcasting station. One way is by the use of programmed buttons in which the user can program a select button to cause the tuner to adjust to a particular radio station. However, this has several limitations. One is that the number of favorite stations that can be preselected cannot exceed the number of buttons or some multiple thereof in the case of those radios which allow multiple layers of button definition. Further, the select buttons are only valid for a limited geographic area. In a car radio, this can be particularly bothersome as hills or range will disrupt reception of the preferred stations. In order to solve this limitation, radios often employ a second means of indirectly tuning the radio. This second way is the socalled "seek" button which allows the user to seek either up or down the radio spectrum for a strong carrier signal. However, the seek button also has its limitations as it is best suited for listeners with either a broad range of subject matter interests or an untiring index finger. For example, for a listener looking for a classical music station there is no alternative but to listen to each station in turn, waiting at times if a commercial is occurring, while repeatedly seeking in order to find that station which broadcasts classical music.

In the world of television, a similar problem exists which is even more extensive. Due to the large number of channels available to most viewers, including the many cable channels now available, a viewer is often overwhelmed by the number of stations available for viewing. Even when the viewer knows the exact program and broadcast channel (for example NBC on 2) the viewer will still have trouble locating the program on cable where the cable channel numbers are often unrelated to the broadcast channel numbers. This problem is further compounded when the viewer is traveling and in an area where he or she is unaware of where NBC is to be found or when the local broadcast station will air the viewer's favorite programs. A known solution to this problem is the guides which are published and which describe local programming. However, these guides are now quite large, often hard to read, not always up to date, and often very incomplete. Another attempted solution is the listing which can be broadcast on a fixed cable station where the listing will give a guide to the local programming. However, the user must first locate this programming guide station, if it exists, and then must often wait until the listing scrolls back to the current viewing time.

A very recent development in the use of digital signal coding is the broadcasting of unique values with program listings. These values are used to enable automatic VCR recording. A fixed guide listing the various channels and programs in a selected area will contain a unique code number for each program. A user punches in the code numbers of the programs which he or she wishes to automatically record on the VCR. The VCR then automatically tunes to those programs when they are broadcast and stores them on tape for later viewing by the user. This type of automatic VCR recording places the burden of program selection upon the user who must wade through large program guides (these units do not help the user locate the code). Further, the selection may be dependent on geographic area, since there may be a necessity to refer to different guides in different geographical areas. This type of automatic tuning is similar in some ways to the tuning of older VCRs with a timer which will allow the user to set the TV channel and time that the VCR is to be turned on and off. The difference is that, with this new development, the user need only enter the program code and the device will then automatically turn itself on and off based on that code selection.

At the other extreme of automatic tuning are the aforementioned programmed select buttons for radio or automatic program selection by some new "smart" radio/TVs based on a knowledge of prior user habits. These devices provide only a limited "choice" among a fixed list of known entries. Preprogrammed selections or selections based on prior habit require that the user have established a stable, geographically fixed environment for viewing. These "smart" devices will not aid the eclectic user or the new user.

In all of these types of tuning arrangements, the user must know the programs that are offered and must make preset selections of specific programs and times in order to automatically record these programs or to directly view/listen to them. Prior art techniques do not allow a user to merely select a subject matter topic (e.g. sports, classical music) where the unit will then provide dynamic, customized filtering in accordance with the topic chosen by the user. Further, these prior art devices are limited to the particular geographic area in which the user is located and they're fixed in terms of the specific programs that are available and the specific times during which these programs are broadcast.

It is apparent that there is at best only limited help to a listener or viewer in locating a station or channel of his or her interest, and in particular there is no way to allow the listener or viewer to make a selection based on subject matter (without knowing beforehand the specific programs that are available) without the necessity of the viewer or listener struggling through many different channels or stations until the channel or station sending the desired subject matter is found.

It is therefore an object of the present invention to provide an apparatus and technique for providing dynamic filtering wherein broadcast signals are filtered for presentation to a user, in accordance with a choice of a topic or subject matter made by the user.

It is another object of the present invention to provide an apparatus and technique wherein a group of broadcast signals is automatically presented to a user based on a choice of general topic or subject matter of interest to the user.

It is another object of the present invention to provide an apparatus and technique for providing dynamic customized filtering of broadcast signals received by a radio or TV device to allow automatic tuning to a plurality of broadcast signals carrying topical information relating to a subject matter choice made by a user.

It is another object of this invention to provide an apparatus and technique for dynamic filtering of broadcast signals received by a radio or TV device in accordance with a subject matter choice made by the user, where the filtering technique is not limited by geographical area.

It is another object of the present invention to provide a low cost, simple device which can be used with existing TVs or monitors, or radios, and which will allow a listener or viewer to locate a channel or station carrying a topic of interest to the user without requiring extensive user involvement in the location of the channel or station.

It is another object of the present invention to provide a device for automatic tuning of a TV or radio in accordance with a general topic selected by the user, where the range of topics from which the selection is made can be continuously updated, and where the user need not have knowledge of the available programming.

It is another object of this invention to provide an apparatus for automatic tuning of any type of audio-video device having a tuner therein which is used to select an arbitrary frequency or frequency range related to a chosen subject matter topic, where automatic tuning occurs without limitation due to geographic area or range from a selected channel or station and without limitation due to the number of available channels or stations.

It is another object of the present invention to provide an apparatus for automatic tuning of an audio-video device in accordance with a topic selection made by the user, where the advantages of the invention increase as the number of channels or stations received by the audio-video device increases.

It is another object of this invention to provide an apparatus and technique for automatic tuning of any type of audio-video device having a tuner therein, where the automatic tuning is accomplished in a manner in which the source of the desired information is substantially invisible to the user.

It is another object of the present invention to provide an apparatus and technique which is particularly suited to automatic tuning in a TV set or monitor to switch between channels or between vertical blanking lines (VBI) lines in accordance with a topic selection made by a user.

It is another object of the present invention to provide an apparatus which can be used with a TV set or monitor to allow a user direct access to information which is not restricted to one broadcast channel or line cluster within that channel, where the user need only indicate the subject matter of interest from a menu or list of topics.

BRIEF SUMMARY OF THE INVENTION

This invention allows a user to gain ready access to information broadcast to a mass audience, and provides automatic user-customized tuning in accordance with the selection of a general topic of interest by the user. The user need not know what specific programs are available or the times of broadcast of particular programs. Tuning is to an arbitrary frequency or frequency range corresponding to a channel or station broadcasting the subject matter topic of interest. This topic interest can be selected from a list which is broadcast with the incoming TV or radio signal, or which can be located in memory in the apparatus. The menu, or list, can be fixed or updated in time, and there can be one or many menus or lists. For example, each TV channel can provide a menu or list characterizing the type of information it transmits, or there can be a master menu or listing organizing by subject matter the information carried by many different channels or stations.

By taking advantage of VBI on television and FM subcarriers on radio the user is offered more control in locating a broadcast of choice. The broadcaster can include digital information along with the traditional signals to allow the apparatus to classify all signal carriers by topic (not by specific program or time of broadcast). Of course, the signal carrier can broadcast different programs matching different subject matter topics at different times of the day. A user makes a topic selection by a key word or via a hierarchy of menus or lists, in each instance using an input device such as voice, keyboard, remote control, etc. Internal logic within the apparatus then instructs the tuner in the TV or radio to advance to the signal carrier or carriers that match the topic selected by the user.

The apparatus can broadly comprise a means for receiving any transmitted digital information that arrives with the broadcast signal, a tuner means for selecting a frequency or frequency range, a data acquisition means (decoder) which extracts or translates digital information in the selected frequency range, a processing means including memory and logic for controlling the tuner in accordance with a topic selection made by the user from a menu or list, a user input device which interacts with the processing means to allow the selection of a topic of interest by the user and the presentation of a list of topics available to the user, and optionally a display means for displaying the menu or list of available topics to the user so that a selection can be made. The digital information which can be broadcast along with the traditional incoming signal can be, for example, transmitted in the vertical blanking interval (VBI) of a TV signal or in an FM subcarrier on an audio signal. Other formats are possible, and the invention is not limited to any particular way in which the digital information relating to classification by subject matter is incorporated in the broadcast signal. Further, the invention is not limited by the means for receiving the broadcast signal, which signal can be received via antenna, cable, fiber optics, etc. It is also possible to have the broadcast signal come directly from a VCR, laser disk, CD, RAM etc. as in a conference situation where a presentation is to be made via a tape onto a monitor to be viewed by a large audience. In this latter situation, a tuner may not be required and the apparatus would then be used to control the decoder (data acquisition unit) in order to present information relating to a desired topic chosen by the user.

This apparatus can be used to automatically tune to an arbitrary frequency in accordance with the subject matter desired to be received by the user, where that subject matter can be the traditional broadcast signal or digital information sent along with the traditional signal. For example, the broadcast signal can contain digital information in addition to the usual radio or video signal. The present invention can be used for automatic tuning to a frequency or frequency range in which the transmitted digital information of interest is automatically selected. In this situation, the digital information in the broadcast signal could include coded information identifying the type of information content of the digital information, as well as the information itself. If the broadcast signal does not include coded digital information classifying the transmitted information by subject matter, the menu or list can contain the classification. For example, the apparatus can store in memory data which classifies by subject matter the present content of any broadcast station or channel.

A particularly interesting application is for Teletext information which is sent with a video signal where many channels transmit information and where endless loop formats are presently used. In this application, the inventive apparatus automatically selects the frequency (channel) and VBI line in which the desired information is located in accordance with a user selection from a menu or list. The data acquisition means or decoder then automatically translates the data in that particular line in which the desired information is located. As the number of channels transmitting information increases and as the amount of information per channel increases, the advantage of the present invention becomes even more apparent since it reduces user involvement and more quickly locates the desired information.

This device utilizes a multi-step selection process (although the term "multi-step" is also used in some cases where only one step selection is required by the user because some preselection process has been incorporated before the user is asked to select). First, a user is allowed to select a subject or topic of interest. The device will then present a targeted display or targeted selection options containing all the programs meeting the user's current interest. This relieves the user of the burden of reading an entire program guide. The second step is the user selection of a program from the targeted list. This allows options and flexibility for new programming not possible with preprogrammed tuning. This selection may be explicit, as from a list, or indirect, using a stop/next function with a seek key.

The terms "menu" and "list", as used herein, are meant to include all textural and visual presentations which provide a user a way to indicate a choice of a topic or subject matter. The menu or list can therefore be formed by icons, real images, graphic lists of topics, etc.

These and other objects, features, and advantages will be apparent from the following more particular description of the preferred embodiments.

BEST MODE FOR PRACTICING THE INVENTION

In a general sense, the invention is an apparatus and technique for automatic tuning in an audio-video device where the automatic tuning is customized in accordance with a topic or subject matter selected by the user. This topic is selected from a menu or list which can be fixed or alterable to allow continuous updating. Further, this menu or list can be located in memory in the apparatus, or can be broadcast as part of the broadcast signal received by the apparatus. A user input device enables the user to make a topic selection and filter logic, or menu logic, is used to receive the input from the user and to provide signals which cause the tuner to advance to the broadcast carrier containing information which matches the selection made by the user. As an option, the menu or list available to the user can be shown on a display means such as a TV screen or a monitor screen, a computer screen, printer, audio output (voice) etc. The audio or video signal is processed in the usual manner while any digital information transmitted with the broadcast signal, which is used to characterize the information content of the signal in accordance with subject matter, is processed for entry into the menu logic or filter logic. The tuner will either be advanced continuously until a match is made, or the tuner will be directly set to a carrier known to provide the desired subject matter. These principals will be more apparent in the following discussion, which will describe the invention as applied to both radio and TV.

Figure 1:
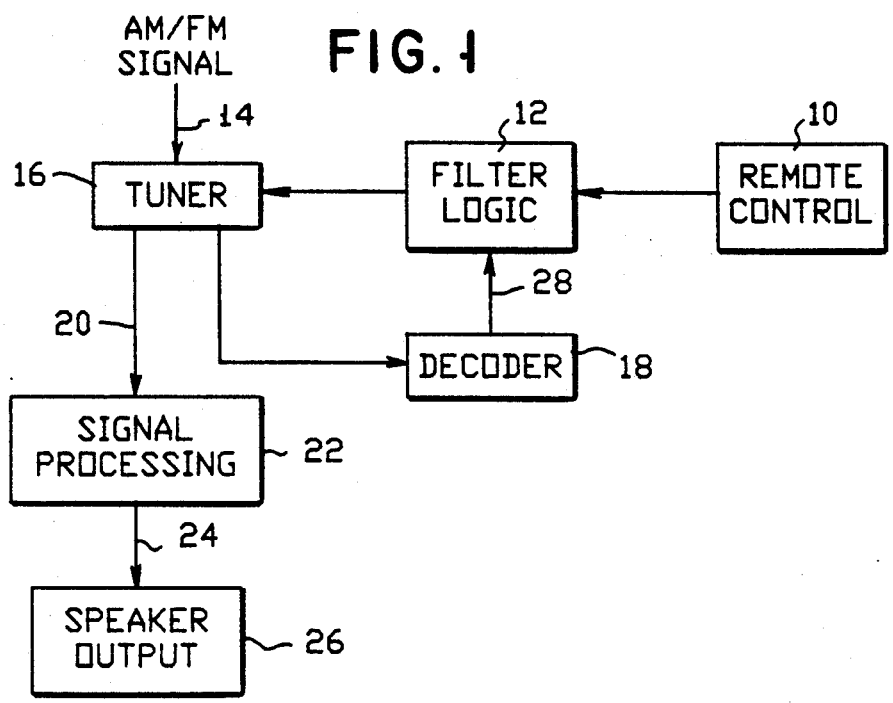
FIG. 1 is a schematic illustration of an apparatus allowing automatic tuning in accordance with a user topic selection as applied to an audio device, such as an AM/FM radio.

FIG. 1 illustrates automatic tuning with an audio device, such as an AM/FM radio. All radio broadcasting is divided into various subject matter categories, for example contemporary music, classical music, rock music, top 40 selections, sports, news, etc. Numbers are assigned to this list so that the subject matter carried by a particular station is characterized by a reference number. Each radio station is encouraged to broadcast the number or numbers of the subject matter category that best suits the station's broadcast information. This number or numbers is broadcast within a subcarrier tied to the fundamental carrier frequency. Subcarriers are already in use for functions such as paging, stock listings, and other commercial interests. Thus, providing a digital subcarrier indicating a number corresponding to a subject matter category is easily within present day capability.

Upon detecting a user-selected topic via an input made by the user, the apparatus causes the tuner to scan the airwaves via an existing seek function in the radio. After the tuner detects a clear signal frequency, a subcarrier decoder checks for a topic category broadcast in the subcarrier. If a topic category number is present and if the detected topic number matches the topic requested, the apparatus would stop the tuner. If there is no match or if the broadcast signal does not include digital information coding the topic category, the apparatus would advance the tuner to the next clear signal. At this time the process would repeat, and the decoder would look for transmitted digital information classifying the subject matter in the transmitted signal. If the code number transmitted with the signal matches the code number of the topic selected by the user the apparatus stops the tuner at that station.

FIG. 1 illustrates a block diagram for carrying out the tuning method described in the previous paragraph. A user input device 10, such as a remote control, keyboard, voice activated unit, etc. provides an input to the filter logic circuit 12. Filter logic circuit 12 is used to compare the user's topic selection choice with the digital information code contained in the transmitted AM/FM signal to determine if a match is made. The broadcast signal is indicated by arrow 14 which is an input to the tuner 16 contained in the audio device. Tuner 16 provides an input to the digital decoder 18 which is used to decode a subcarrier transmitted with the broadcast signal and which would contain a digital code categorizing the subject matter of the incoming signal. For example, the digital code could indicate that this station is broadcasting classical music. The tuner also provides an output along line 20 to the conventional audio circuits which process the audio signal for output via the speakers. These conventional circuits are indicated by the signal processing unit 22 which provides an output via line 24 to the speakers 26.

The digital decoder 18 provides an output via line 28 to the filter logic circuit 12. The output from decoder 18 is the characterization code contained in the subcarrier of the AM/FM signal received by the tuner. Filter logic 12 then compares that code number with the topic selection made by the user using input device 10. If a match is made, an output is sent from filter logic circuit 12 to the tuner 16 halting the tuner at that station. If no match is made, the filter logic will provide an output telling the tuner to continue to advance, or seek, to the next clear station. This will continue until a match is made, at which time the signal from the filter logic circuit 12 will tell the tuner to stop at that station.

The filter logic circuit 12 can be of conventional design providing the usual compare functions which cause the tuner to continue to seek new stations or to stop at the station which provides a match.

Figure 2:
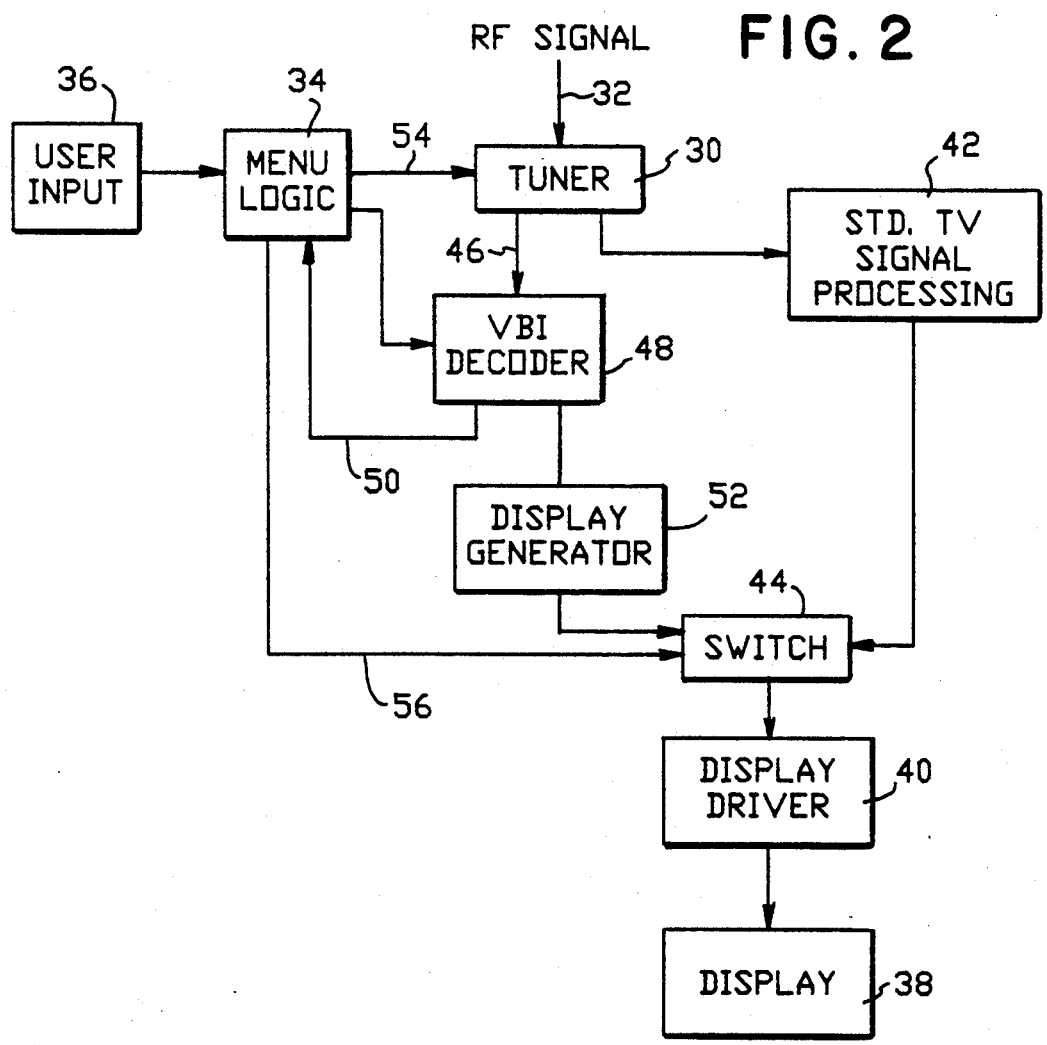
FIG. 2 is a schematic illustration of an apparatus used to provide automatic tuning in accordance with a user topic selection for use with a TV set or monitor.

FIG. 2 illustrates the application of this invention to a TV set. The use of FM subcarriers to the audio signal can be used for automatic tuning in a manner similar to that described with respect to the radio apparatus of FIG. 1, or the VBI lines can be used to carry the digital information characterizing the information content of the received signal. In addition the TV screen display provides advantages which allow a more advanced system to be constructed, where the system is one that does not rely on voluntary broadcaster participation. For example, one or more VBI lines could be purchased on a local station. The tuning logic can be set upon installation to locate these lines or the logic can instruct the tuner to scan all VBI lines looking for a unique signal identifying code. This VBI broadcast would contain many pages to support a hierarchy of menus or lists for topic selection. For example, SPORTS can be a topic on the main menu followed by BASEBALL on a second level menu. Such VBI menu systems are well known in the art and currently in use around the world. Upon reaching the full topic description (BASEBALL) the VBI decoder would then display the page(s) of baseball games currently in progress and those about to begin in the immediate future. This feature is also common in conventional VBI systems, for example with respect to stock reports which are currently broadcast with continual updating. The user would then select the preferred game from the menu display on the TV and the tuner would automatically advance to that game in accordance with a signal received from the menu logic circuit. The actual channel location of the game could be completely invisible to the user but included in the digital VBI data that creates the menus. In this system, the menus can be broadcast or can be stored in internal memory. A master menu can be used to encompass the information content of several TV or cable channels, or the channels can choose to transmit their own menu or menus.

Referring to FIG. 2, the TV tuner 30 receives an input RF signal as indicated by arrow 32. This signal can be received by antenna, cable, fiber optic, etc. It can contain digital information which codes the information in the RF signal in accordance with subject matter. A menu logic interface 34 is provided which functions in a manner similar to the filter logic circuit 12 of FIG. 1. That is, menu logic unit 34 is an interface between the user and the tuner which reads the menus or lists and provides a signal indicative of where the tuner should go to locate channels delivering information which matches the topic selection made by the user.

A user input device 36 (remote control etc.) is used by the user to make a topic selection from any menu or listing which could be presented on the TV display 38. Display 38 is connected to the usual display driver 40, which is a well known circuit. In FIG. 2, two different signal processing paths are provided. One is the usual video signal processing path wherein the video output of the tuner is sent to the standard TV signal processing circuits 42 and then to a switch 44. The other signal processing circuit is for the coded digital information which is used to characterize the information content of the video signal being transmitted by that channel. This digital information is decoded and used by the menu logic unit 34 to automatically adjust the tuner. This second signal processing path also provides an input to switch 44 to enable display of the menu or listing of interest or the broadcast video signal. Menu logic unit 34 provides a signal to switch 44 allowing either a menu or the broadcast video information to be shown on the display.

In more detail, the tuner 30 provides an output via line 46 to the VBI decoder 48. Decoder 48 decodes the coded digital information broadcast along with the video signal, and provides an output back to the menu logic unit 34 via line 50. Decoder 48 also provides an output to a display generator 52, which is used to provide information suitable for display onto the display unit 38. This can be either a display adequate for a computer or a display adequate for a TV.

Menu logic unit 34 provides an output to tuner 30 via line 54. This is the control signal which instructs the tuner to automatically move to a channel transmitting information which matches the viewer's selection made by an input from the user input device 36. Menu logic unit 34 also provides an input to VBI decoder 48 to control the VBI line being decoded by decoder 48. As noted, a switch control signal is provided via line 56 from the menu logic unit 34 to switch 44. This switch control signal determines whether the video signal is passed to the display driver 40 or whether a menu is passed to the display driver 40.

The components shown in the block diagram of FIG. 2 are well known in the art. Examples of these will be described in more detail with respect to FIG. 4, which is a more complete diagram of a system designed to utilize digital coding information transmitted in the vertical blanking interval.

Figure 3:
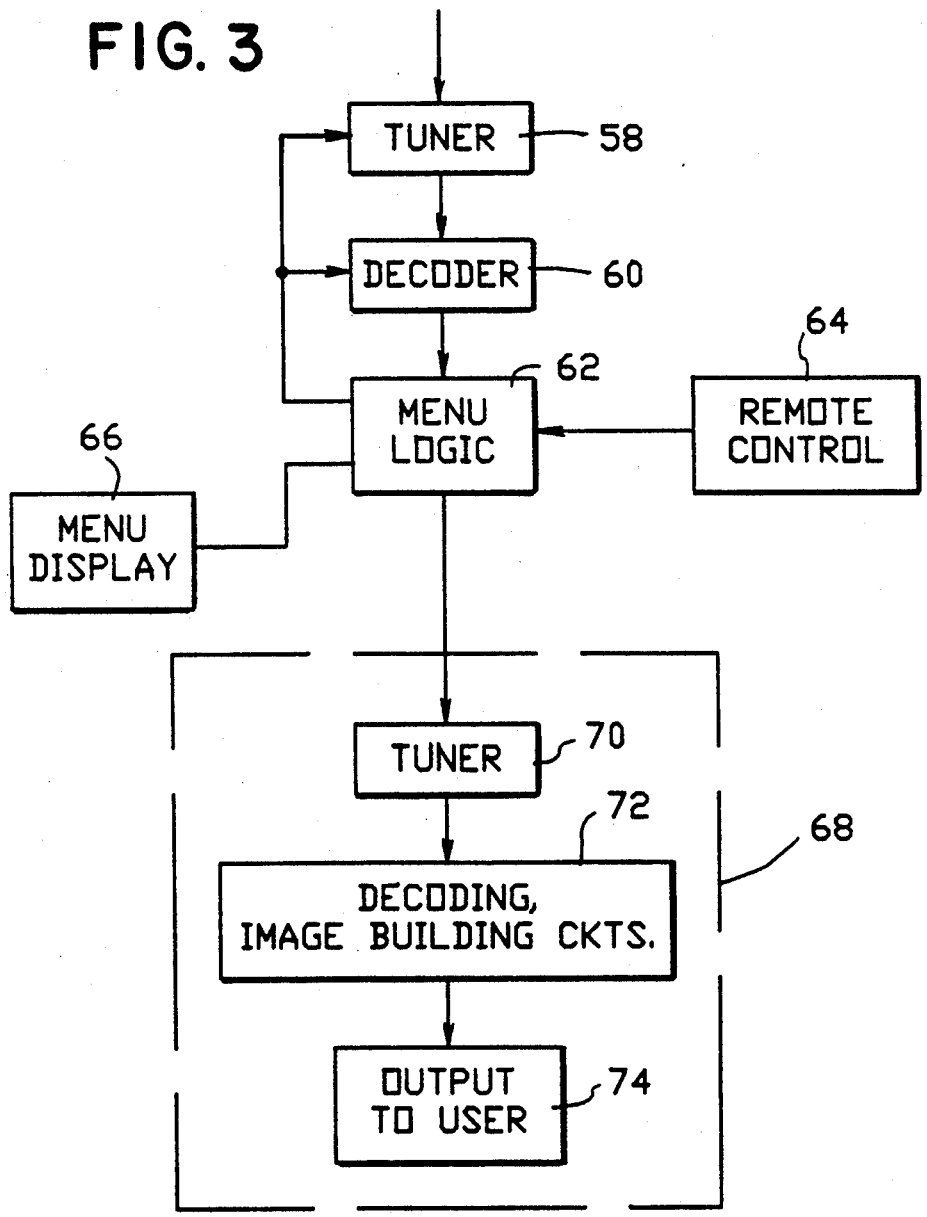
FIG. 3 is another block diagram of an automatic tuning apparatus in accordance with the present invention used with a TV set or monitor, where two separate tuners are applied, one of which is used with the digital information transmitted with the traditional broadcast signal, while the other is the tuner which is normally a part of a TV set.

FIG. 3 is a block diagram of an apparatus for use with an audio-video device and is similar to the block diagram of FIG. 2, except that a separate tuner is used for the coded digital information that is broadcast along with the video signal. The broadcast signal is sent to a tuner 58 whose output is sent to a decoder 60 which decodes the digital coding data transmitted with the broadcast signal. Decoder 60 provides an output to the menu logic unit 62 which receives inputs from the user via user input device 64. A menu display unit 66 is optional, it being possible to display the menu on the TV set as indicated with respect to the apparatus of FIG. 2. Menu logic unit 62 provides an input to both the tuner 58 and decoder 60.

In this embodiment, a separate tuner is provided for the digital information used to code the incoming broadcast signal in accordance with subject matter categories. The audio-video device 68 includes the conventional tuner 70, decoding and image building circuit 72, and outputs 74 to the user. These outputs include display onto the screen of the TV set or monitor, or speakers in the case of an audio device.

In this apparatus, tuner 58 selects the frequency of the carrier signal and decoder 60 extracts the digital information which catalogs the transmitted signal in accordance with subject matter. Menu logic unit 62 receives both this digital information and a signal from the user indicating the topic matter of interest. Depending upon a reading of the digital information transmitted with the broadcast signal, the menu logic unit provides an output to the tuner and decoder to look for another broadcast signal or portion within that signal in order to find a match. When a match is found, a signal is transmitted to the tuner of the audio-video unit 68 in order to automatically change that tuner.

FIG. 4

Figure 4:
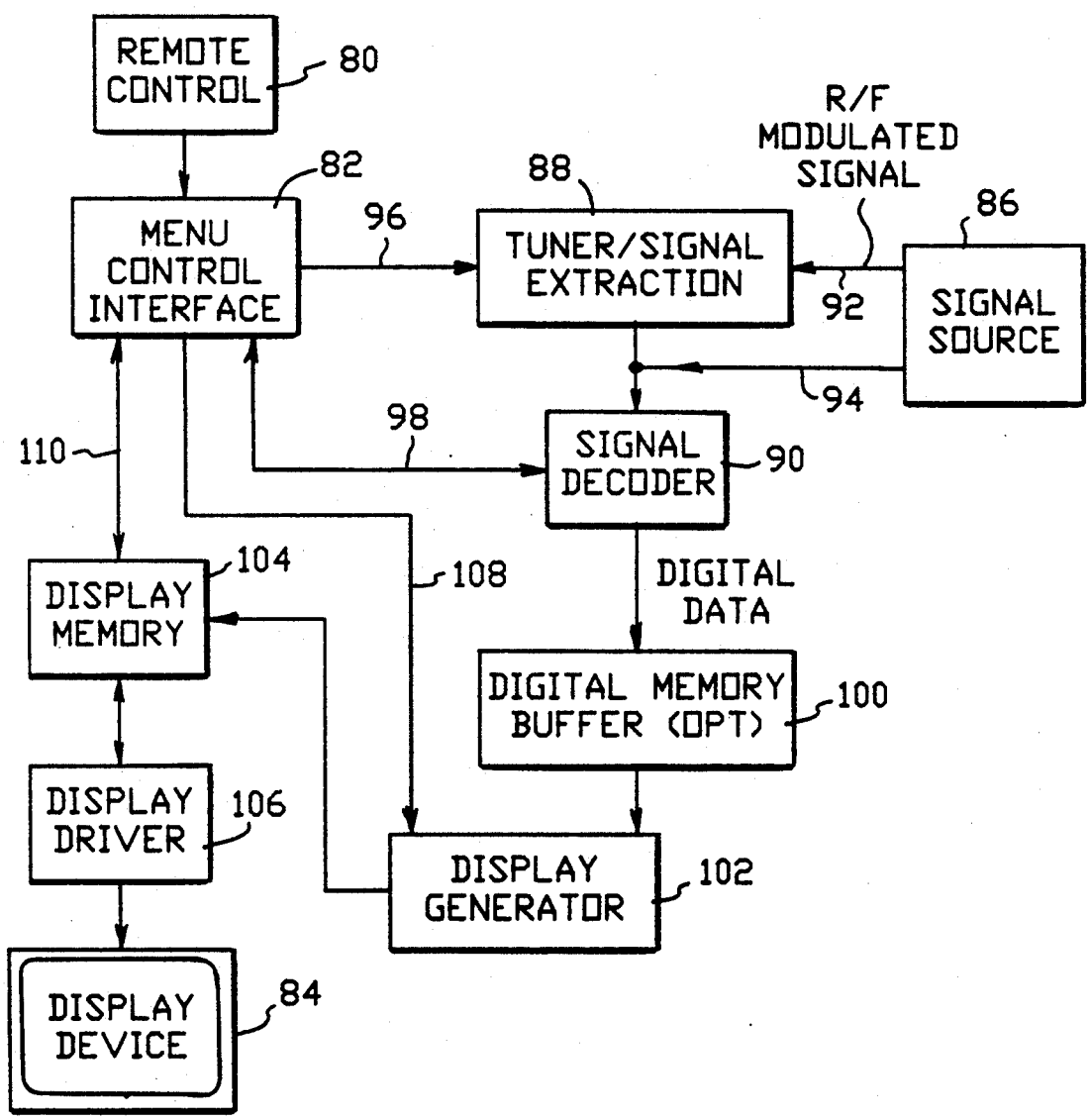
FIG. 4 is a block diagram of an apparatus which is particularly suitable for use with a TV set or monitor, and in particular for a VBI multi-signal subject tuning device, using fixed or VBI-defined menus from which the user selects a topic.

FIG. 4 is an apparatus particularly designed for transmitting digital coding information such as teletext now found in the vertical blanking interval (VBI) of a broadcast signal. The system of FIG. 4 provides automatic tuning in accordance with this digital information. As background, it is well known that digital data is often transmitted along with an incoming signal, where the digital data can be provided to selected subscribers, or to the public at large. For example, subscribers to private systems can receive services related to business and stock market quotations, where the stock market prices are transmitted over telephone lines and are received by a modem at the subscriber's terminal. Having a computer and keyboard entry device enables the subscriber to selectively access digital data which is sent over the telephone lines, in order to display this data on a computer screen. Many services of this type are available, but the expense of the service is not trivial. Additionally, the subscriber must have a computer and a modem in order to be able to fully participate in the range of services offered to the subscriber. Information retrieval and subscriber service systems of this type which use modems are not within the scope of this invention.

In addition to these subscriber services, many TV channels transmit programs including digital data, where the digital data is transmitted with video signals and is stored in the vertical blanking interval (VBI). This data can be extracted using a decoder which then re-integrates the translated digital data to a regular video signal that can be displayed on the TV screen. Close-captioning is done this way where the captions are displayed on the screen simultaneously with the video picture.

Three major applications of VBI lines exist in common use today. The first is for TV control data to support color levels, signal synchronization, and VCR programming control. A second application is line leasing wherein a company can buy a time slice for a single transmission of data via VBI to authorized reception sites. A third application is in the delivery of public information, although access by the public can be restricted by the use of data encryption, authorization by box ID, or through the use of custom data formats.

An existing system is the Teletext system authorized by the FCC in lines 10-18 of the transmission band. Teletext is a one-way data transmission system that is sent out as part of a TV signal, whether the signal is sent out via satellite, cable, or regular broadcast TV. The Teletext information is available free of charge to viewers, and there are many types of Teletext services being offered at this time. These services cover topics such as cultural affairs, home and catalog shopping, sports, news, financial information, weather, and other types of statistics. Such Teletext information is regularly offered by the major networks.

Teletext and graphics are transmitted as digital data squeezed into a broadcast television signal in the vertical blanking interval. This interval is the time at the end of each television field when the cathode-ray beam is cut off while it returns to start the next field. Teletext is sent as an endless loop of pages where the data for the pages are transmitted serially at the rate of 13,500 bits per second, per VBI line used. The total rate of transmission is dependent upon the number of lines (up to 8) used to transmit the data.

At the user end, a decoder is used to convert the Teletext data to a regular video signal that can be displayed on a TV screen. Any of the pages in the loop can be accessed at random. However, because an endless loop format is used, it takes time for each page to come around in the loop. This means that there is a delay between the time the page number is entered and the time that the page actually appears on the TV screen. In turn, this imposes a practical limit to the number of pages that a Teletext service can offer. One way to alleviate this delay is to transmit the more important pages of information more than once within the endless loop, so that these pages will come up faster. For example, indices are transmitted several times in the loop since these pages are more important to the users.

When using Teletext, it is not possible to access any page of information without the attendant delay in being able to extract and display the digital information. The endless loop of information is continuously updated and is often changed so that a desired page is no longer part of the loop of information that is transmitted. Since the presently available Teletext decoders are rather expensive, and further since the ease of extracting information is limited, such systems have not found great popularity. The apparatus and technique described in U.S. Pat. No. 4,894,789 (K.Y. Yee) addresses these problems and describes a system in which consumers can economically utilize the digital data that is sent with video signals. The device of that patent allows a user to extract selected information and to store and retrieve this information without the described restrictions normally attendant to the endless-loop format.

As noted, public information is traditionally rebroadcast in very brief (30 seconds) repeat loops which allow the user to jump between information pages. The disadvantage of the repeating data loops is that a long loop will bore the user while the user waits for the requested page to arrive, while a short loop severely limits the amount of information that can be delivered. To increase the amount of information without increasing the waiting time, modern decoding boxes can support VBI services that transmit continuously on several adjacent VBI lines. However, current FCC limitations allow at most 10 VBI lines per channel. This means that, at best, a single channel VBI service could offer ten times the information of a single line service.

One way to escape the limitation described in the previous paragraph is to purchase individual lines or clusters of lines on a multiplicity of channels. Each line or line cluster could run a separate data loop, each loop being 30 seconds long. With existing Teletext devices the user would be required to turn to a particular channel for a particular subject, such as channel 4 for weather and channel 7 for sports, or as an alternative would require the user to specify a particular VBI line for weather and another VBI line for sports within the same channel. The burden of locating the correct information loop is currently upon the user. As will be appreciated, as the number of channels increases and as the number of VBI lines used to transmit digital information increases, the burden upon the user becomes excessive.

The apparatus of FIG. 4 automatically locates information relevant to a desired topic based on a selection made by the user from a master menu, or other menu, which can be presented on a display, such as a TV set, monitor, printer, etc. The apparatus can include a tuner for the selection of a frequency or frequency range and a decoder for translating relevant information within the desired frequency or frequency range. There is a menu control interface between the user and the tuner which automatically controls the tuner in accordance with a menu selection made by the user. This is particularly advantageous if large amounts of input data are received which are in many different channels and where the information content within any given channel is very lengthy. Thus, the source of the relevant information can be invisible to the user and is located by this apparatus without extensive involvement and participation by the user. The master menu or menus covering different topics can be stored in memory or, as a preferable alternative, can be transmitted with the incoming information so that the master menu or any other menu can be constantly updated in accordance with the updating of the information. As an example, a cable company owning several channels can have a master menu describing the information content in a topical way that is transmitted along with the incoming video signal. This master menu can list the topics of digital information which the viewer may wish to extract. The master menu can be presented on the display device by an entry made for example through a remote control, and the viewer can then select a topic from this master menu. Means are provided to automatically change the tuner and the data acquisition unit (decoder) to go to the proper channel and the selected page of information within that channel in order to deliver information relative to the selected topic to the display device.

Of course, every channel can present its own menu describing the various topics about which information is sent with the video signal. In that case, the user would call up the menu relating to that channel, select a topic from the menu, and the apparatus would automatically decode all of the information received from that channel in order to select and present on the display device information relevant to the selected topic. In this case, also, there is automatic tuning and decoding based on the menu control interface, where the source of the information, (for example, a channel or page within an endless loop of data presented within that channel) is substantially invisible to the user. As will be appreciated, as the number of channels or frequencies in which digital information is transmitted is increased, and as the information content within each channel is increased, this automatic tuning and/or decoding provides a tremendous advantage and makes more user-friendly systems in which information is transmitted along with other signals such as video, FM, etc.

Referring more particularly now to FIG. 4, a user input device 80, such as a conventional remote control, key pad, joy stick, touch screen or touch pad, etc. allows the user to interact with a menu control interface circuit 82. The menu control interface circuit is used to present a master menu or another menu for review by the viewer on a display device 84 which could be a computer screen, a TV screen or monitor screen, a printer, etc. and to control other circuitry based on a menu selection by the user.

An input signal is received by the unit 86, which could be a cable feed, antenna, fiber optic, etc. An example is a composite video-digital input as might be presented by a channel transmitting digital data in the vertical blanking interval of the TV signal which also contains the video information.

The apparatus also includes a tuner 88 and a data acquisition unit 90, which is conventionally a signal decoder. Depending upon the type of incoming signal, digital, analog, FM, etc. many different types of decoders are known in the art for decoding these signals. The tuner is used for signal extraction and would select a frequency or frequency range in which the input information is received. For example, the tuner would select one of the many channels that are used for transmission of TV signals. The signal source 86 is connected to tuner 88 via line 92 and is also connected to the signal decoder or data acquisition unit 90 via line 94. If the input signal source is a video or intermediate frequency demodulated signal of the type received from a VCR, channel selection, or frequency selection, is not necessary and the input signal would be sent over line 94 directly to the decoder 90. Typical analog input signals such as RF/modulated signals are transmitted on line 92 to the tuner-signal extraction circuit 88.

In accordance with the present invention, automatic frequency selection and/or decoding is accomplished in accordance with a menu selection made by the user. An input for tuner control is provided from the menu control interface circuit via line 96 to the tuner 88 and via line 98 to the signal decoder or data acquisition unit 90.

Information relevant to a desired topic, as selected by the user from the menu displayed on a display device 84, is also presented on this display device. This is accomplished through the digital memory buffer 100 (which is optional) the display generator 102, the display memory 104, and the display driver 106. Components 100, 102, 104, and 106 operate to present in the appropriate display format the digital data selected by the data acquisition unit 90, where display control is accomplished by signals providing display control from the menu control interface 82 via lines 108 and 110. Depending upon the speed of the display generator 102 the digital memory buffer 100 may not be needed. Display generator 102 creates bits for display, taking digital input information and converting it to an appropriate character representation for display on display device 84. The display driver 106 is also a well known component and is used to make certain that the bits to be displayed arrive at the proper speed for presentation on the display device 84. Normally, display driver 106 would read the digital bits from a buffer, such as the display memory 104.

The menu control interface could be a portion of a central processing unit or could be a separate integrated circuit within the processor. The connections from the menu control unit 82 to the tuner 88, decoder 90, display memory 104, display generator 102, and display driver 106 could be via a control bus which is well known in the art.

The menu control interface can include logic circuits which provide selection of a particular channel and also of a particular VBI line if the desired incoming information is transmitted in the vertical blanking interval of an incoming video signal. This logic could be provided either by hardware or software.

As an example of components which can be used for the various units in the block diagram, the user input device 80 can be a remote control, a keypad, joystick, touch screen, touch pad, etc. The display device 84 can be, for example, a TV or monitor screen, a computer screen, a projection screen, a printer, etc. The input signal can be provided from a cable feed, antenna, fiber optic connection, telephone line, etc. The menu control interface can be a single chip or a plurality of chips, or be provided through programming. Any microprocessor chip, such as an Intel 8086 or 80286, is suitable. The tuner/signal extraction unit 88 can be a standard VCR or TV tuner with remote input. The data acquisition unit, or signal decoder 90, can be a Phillips SAA 5231 video processor chip. The digital memory buffer 100 can be any memory chip as available from many vendors. The display generator 102 is, for example, provided by a Phillips SAA 5245 Teletext decoder chip. The display memory 104 is also any conventional memory chip as provided by numerous vendors. The display driver 106 can be the Motorola MC 1383 chip graphic driver. As an alternative, ITT markets a chip (CCU 3002) that can provide menu control functions and display onto a screen.

In operation, a user would turn on the apparatus and then enter a signal from the user input device to the menu control interface 82. This signal would request a menu to be shown, such as a master menu describing many different topics which may be available over several frequency ranges or channels. The menu control interface unit 82 would then notify the tuner and would automatically select the channel over which the master menu is broadcast. As an alternative, the master menu can be in memory which would be called forward by the menu control interface for display on unit 84. The user would then make a selection of a particular topic from the master menu and this would cause the menu control interface to provide another signal over line 96 to the tuner 88 for selection of a particular frequency or frequency range. There would also be a signal over line 98 to the data acquisition unit or decoder 90 in order to select where in the desired frequency range or channel the relevant information is located. The data acquisition unit would then extract information relevant to the topic selected by the user for presentation to the digital memory buffer 100, or directly to the display generator 102 if the display generator is sufficiently fast. This information would then be displayed on the display unit 84 using the display memory 104 and display generator 106.

The master menu or any other menu can be transmitted as information along with other digital information. This allows the information sender, such as a cable company, to constantly update the menus in accordance with updating of the digital information. Thus, as a preferable alternative the menus are broadcast along with the data and can be directly presented on the display device 84 by the user, as well as being entered into memory under control of the menu control interface circuit 82. The menus can list the topics and also include submenus for further elaboration of information relative to any particular topic. If desired, the menus can indicate the channel or frequency range in which the relevant information is contained, but such address listing is not necessary in this apparatus where the selection of a particular frequency range and a page of information within the particular frequency range are automatically accomplished. Once the user selects an information topic this apparatus can locate the correct data loop by using an internal lookup table stored in a random access memory or read-only memory, or the apparatus could pull the location off a broadcasted master index. Once the apparatus switches lines/channels the user will be offered additional levels of choices to further define and locate the desired information. As noted, these additional choices could result in further internal line/channel switching. Once all choices are made the apparatus can operate as a standard Teletext decoder within the selected data loop requiring the user to request the master index to switch data loops or the existence of separate data loops can be hidden from the user and every information page request could result in internal line/channel switching totally unseen by the user.

While the invention has been shown with respect to particular embodiments thereof, it will be apparent to those of skill in the art that changes can be made without departing from the spirit and scope of the present invention. For example, different levels of programming can be made to accomplish a desired function through various programs or subroutines, or additional levels of hardware can be provided to provide different levels of automatic location and selection of information. It is also anticipated that techniques, including filtered seek (digital information coding the subject matter content of the broadcast signal sent along with the signal) and menu or list selection, may be envisioned to provide tuning to an arbitrary frequency in accordance with a general or specific subject matter topic (content) chosen by a user.

We claim:

1. An apparatus for automatic tuning control in a receiver which receives broadcast signals, said tuning control being by a filtered seek operation, wherein said apparatus includes:

receiving means for receiving incoming broadcast signals and providing an output to a tuner, each of said signals having associated therewith coded data characterizing the subject matter content of the associated broadcast signals, a tuner for selecting a frequency or frequency range from the output of said receiving means and for providing an output to a reading means.

reading means for reading said coded data accompanying a broadcast signal in said frequency or frequency range from said tuner, and for providing an output to a comparison means, a user input device enabling a user to interact with said apparatus to make a selection of a subject matter topic, comparison means for comparing the use's selection of a subject matter topic with the coded data from said reading means characterizing the subject matter content of a broadcast signal corresponding to said frequency or frequency range, means for advancing said tuner in a seek mode to a plurality of frequencies, and control means between said means for advancing and said comparison means for deciding whether to advance said tuner based on whether a match is made between said coded data from said reading means and said user's selection of a subject matter topic.

2. The apparatus of claim 1, where said means for advancing advances said tuner through a succession of broadcast signals having subject matter content matching the subject matter topic chosen by the user, said control means including further means enabling the user to prevent said means for advancing from advancing to the next broadcast signal having a match in subject matter to the subject matter topic chosen by the user.

3. The apparatus of claim 1, where said control means includes means to hold said tuner at a frequency corresponding to a broadcast signal having a subject matter content matching the subject matter topic chosen by said user, said apparatus including further means for advancing said tuner to another broadcast signal in response to a signal from said user causing said advancing, said another broadcast signal having subject matter content matching the subject matter topic chosen by the user.

4. The apparatus of claim 1 where said coded data is digital data.

5. The apparatus of claim 4, where said broadcast signals are composite video-digital signals, said digital coded data being transmitted in the vertical blanking interval of said video signal.

6. The apparatus of claim 4, where said digital data is carried in a FM subcarrier.

7. The apparatus of claim 1, further including means for using said broadcast coded data to produce a list of broadcast signals having subject matter content matching the subject matter topic chosen by said user.

8. The apparatus of claim 7, further including display means for displaying said list of broadcast signals having subject matter content matching the subject matter topic chosen by said user.

9. The apparatus of claim 8, where said control means includes means for advancing said tuner in response to a selection made by said user from said list.

10. The apparatus of claim 1, further including means for using said broadcast coded data to produce a list of broadcast signals having common subject matter content based on said coded data.

11. A method for automatic control of a tuner in an audio-video apparatus in accordance with a subject matter choice made by a user, including the steps of:

receiving a plurality of broadcast signals each of which includes audio or video information and coded digital data classifying the audio or video information in accordance with subject matter topics, reading coded digital data corresponding to a broadcast signal of a particular frequency or frequency range and providing an output to be compared to a choice of subject matter topic made by a user, advancing a tuner in said apparatus in seek mode to a plurality of frequencies, comparing said coded digital data in said output from said reading step with a subject matter topic selected by a user to determine if matches are made, and controlling the further advance of said tuner based on whether a match is made.

12. The method of claim 11, including the step of using said broadcast coded digital data to instantaneously form a list of broadcast signals having subject matter content matching that of the user's selection of a subject matter topic, and displaying said list to said user.

13. The method of claim 12, including the further step of making a selection of a broadcast signal from said list and advancing said tuner automatically to the frequency corresponding to the broadcast signal selected from said list.

14. The method of claim 11, including the step of using said broadcast coded digital data to instantaneously form a list of broadcast signals having common subject matter based on said coded digital data.

* * * * *